United States Patent
Litwin et al.

(10) Patent No.: US 6,365,918 B1
(45) Date of Patent: Apr. 2, 2002

(54) METHOD AND DEVICE FOR INTERCONNECTED RADIO FREQUENCY POWER SIC FIELD EFFECT TRANSISTORS

(75) Inventors: Andrej Litwin, Danderyd; Ted Johansson, Djursholm, both of (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/414,970

(22) Filed: Oct. 12, 1999

(30) Foreign Application Priority Data

Oct. 13, 1998 (SE) .............................. 9803485

(51) Int. Cl.[7] .................. H01L 29/80; H01L 27/01; H01L 23/12; H01L 21/20; H01L 21/60
(52) U.S. Cl. .................. 257/77; 257/280; 257/284; 257/76; 257/78; 257/267; 257/286; 257/340; 257/208; 257/203; 438/309; 438/421; 438/459; 438/977
(58) Field of Search .................. 257/77, 280, 284, 257/287, 472, 329–344, 267, 74, 78, 286, 12, 200, 624, 275, 784, 786, 203, 208; 438/309, 421, 459, 977

(56) References Cited

U.S. PATENT DOCUMENTS

| | | | |
|---|---|---|---|
| 4,360,821 A | * | 11/1982 | Tsukada et al. |
| 5,135,890 A | * | 8/1992 | Temple et al. |
| 5,264,713 A | * | 11/1993 | Palmour ..................... 257/77 |
| 5,270,554 A | * | 12/1993 | Palmour ..................... 257/77 |
| 5,463,242 A | * | 10/1995 | Kubo ....................... 257/372 |
| 5,514,604 A | * | 5/1996 | Brown |
| 5,821,576 A | * | 10/1998 | Sriram ..................... 257/284 |
| 5,834,840 A | * | 11/1998 | Robbins et al. ............. 257/705 |
| 5,841,184 A | * | 11/1998 | Li ......................... 257/580 |
| 5,964,942 A | * | 10/1999 | Tanabe et al. .............. 117/87 |
| 6,124,179 A | * | 9/2000 | Adamic, Jr. ................ 438/309 |
| 6,274,889 B1 | * | 8/2001 | Ota et al. .................. 257/77 |

FOREIGN PATENT DOCUMENTS

| | | |
|---|---|---|
| EP | 0 750 352 | 12/1996 |
| WO | WO 96/06458 | 2/1996 |

OTHER PUBLICATIONS

Patent Abstracts of Japan; JP 4–109637 A (Sharp Corp.); Apr. 10, 1992; *abstract* .
"Inside the RF Power Transistor"; *Applied Microwave& Wireless*; T. Johansson; p. 34; Sep./Oct. 1997.
"Microwave Transistors: Theory and Design": *Proc. IEEE*, vol. 59, p. 1163; H. F. Cooke; Aug. 1971.

* cited by examiner

*Primary Examiner*—Alexander O. Williams
(74) *Attorney, Agent, or Firm*—Burns, Doane, Swecker & Mathis, L.L.P.

(57) ABSTRACT

The present invention relates to a method and device for interconnecting radio frequency power SiC field effect transistors. To improve the parasitic source inductance advantage is taken of the small size of the transistors, wherein the bonding pads are placed on both sides of the die in such a way that most of the source bonding wires (6) go perpendicularly to the gate and drain bonding wires (7, 8). Multiple bonding wires can be connected to the source bonding pads, reducing the source inductance. An additional advantage comes from such arrangement by reducing the mutual inductance between source/gate and between source/drain due to the orthogonal wire placement.

9 Claims, 5 Drawing Sheets

METHOD AND DEVICE FOR INTERCONNECTED RADIO FREQUENCY POWER SIC FIELD EFFECT TRANSISTORS

This application claims priority under 35 U.S.C. §§119 and/or 365 to 9803485-3 filed in Sweden on Oct. 13, 1998; the entire content of which is hereby incorporated by reference.

FIELD OF THE INVENTION

The present invention relates to a method for interconnecting radio frequency power SiC field effect transistors, a device comprising an interconnect design for frequency power SiC field effect transistors and a radio frequency power SiC field effect transistor with the interconnect design.

BACKGROUND OF THE INVENTION

Silicon carbide (SiC) transistors have started to be alternatives to both Si and GaAs transistors for power generation at GHz frequencies. They have been predicted and also shown experimentally to handle much higher power density in comparison to the other mentioned transistor types, i.e. the same size transistors can generate several times higher power, depending of the superior material properties. In order to fully utilise the advantages of the SiC dies in a real transistor package, the connection of the die to the package should also be modified. With a conventional MESFET design, featuring interdigitated gate and source bonding pads 1, 2 and wires 3, 4 as shown in FIG. 1, the parasitic inductance from the bonding wires 3, 4 will be much higher for SiC transistor than for the other material types, since the smaller die will allow fewer bonding leads. Especially the parasitic source inductance is deleterious for the transistor characteristics.

SUMMARY OF THE INVENTION

A new way to improve the parasitic source inductance is to take advantage of the small size of the transistors and place the bonding pads on both sides of the die in such a way that most of the source bonding wires will go perpendicularly to the gate and drain bonding wires. Multiple bonding wires can be connected to the source bonding pads, reducing the source inductance. An additional advantage comes from such arrangement by reducing the mutual inductance between source/gate and between source/drain due to orthogonal wire placement.

In a case when multiple transistor dies have to be placed in the same package, a jumper chip can be placed between the dies, to simplify bonding procedure and further reducing the source inductance.

The invention will be further described with reference to preferred embodiments and enclosed drawings.

DETAILED DESCRIPTION OF THE PREFERRED EMBODIMENTS

Figure 1:
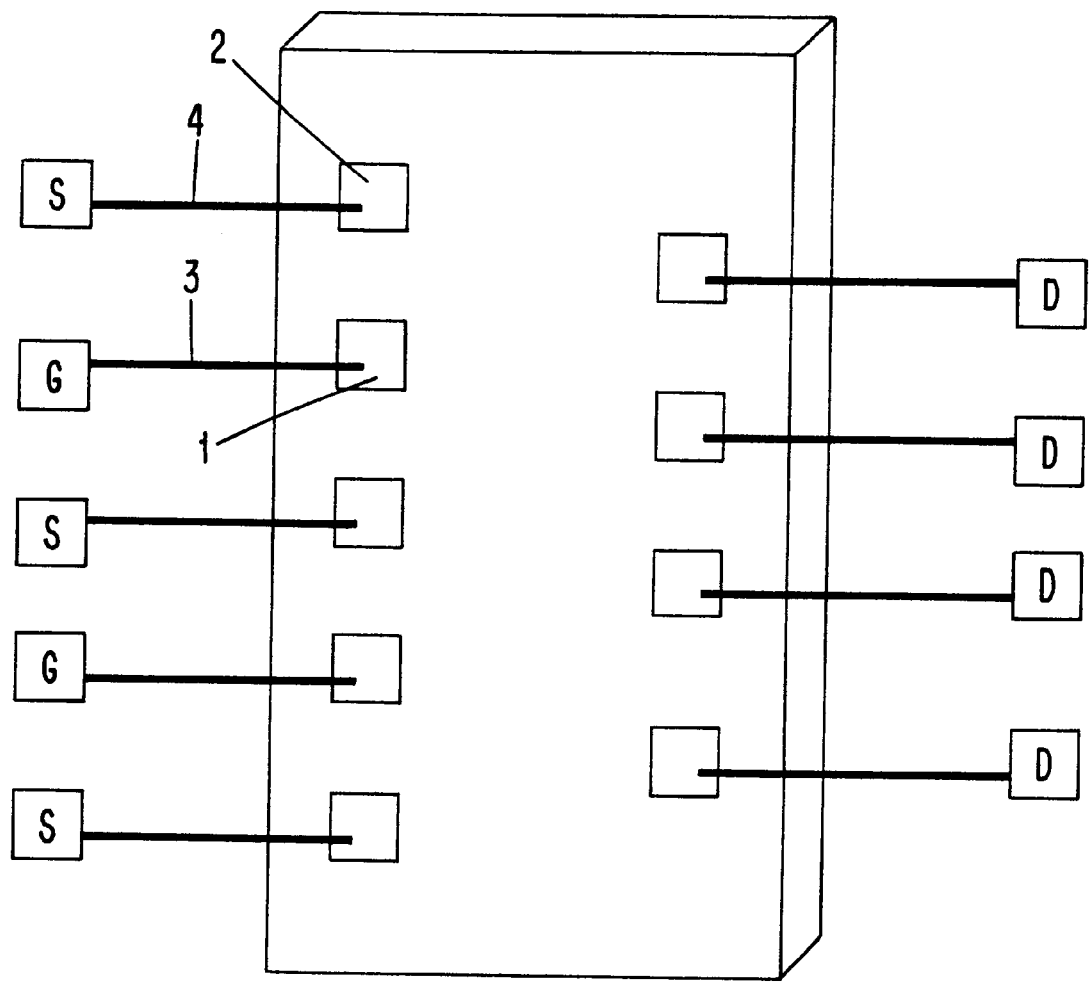
FIG. 1 is a design for a conventional placement of wires and bonding pads on a die for a MESFET.

Active devices for high-frequency power amplification are widely used in output parts of communication systems. At high power levels, in excess of typically 1 kW, vacuum tubes or other forms of amplification are used. Travelling wave tubes (TWTs)—klystrons—are used for power levels up to 10 MW. At lower power levels, solid-state transistors are used for almost all RF power amplification. High-frequency transistors were first fabricated in germanium in the late fifties, but were soon replaced by silicon bipolar transistors in the beginning of the sixties, and have since then dominated the RF-power, see ref.: H. F. Cooke, "Microwave Transistors: Theory and Design", *Proc. IEEE*, vol 59, p. 1163, August 1971.

For cellular radio, silicon bipolar transistors are totally dominating in the base station output amplifiers, and can deliver great performance up to at least 2 GHz with good stability, availability and price. Other technologies of choice for this class of applications are GaAs MESFETs and the recently developed laterally diffused MOS-transistor (LD-MOS). There is a strong driving force to further improve the existing technology, as well as to explore new types of devices, because of the rapidly expanding telecommunication market.

Power transistors are especially designed to deliver high output power and high gain. Manufacturing process, device parameters, layouts and package have been carefully tuned for this purpose. The devices need to meet numerous detailed requirements for breakdown voltages, DC gain or transconductance, capacitances, RF gain, ruggedness, noise figure, input/output impedance, distortion etc. The operation frequency range from several hundred MHz up into the microwave region. About 1 W output power is a starting level where special considerations have to be taken into account, and may serve as a loose definition of power device, compared to a "normal", IC-type of transistor. Usually only one n-channel devices is used on a single die. The output power requirements range up to several hundred watts, sometimes even kilowatts, and the high output power is achieved by paralleling many transistor cells on a single die, and paralleling several dies in a package. The packages often have large gold-plated heatsinks to remove heat generated by the chip. Silicon carbide transistors have recently been extensively studied as an alternative to both Si and GaAs transistors for power generation at GHz frequencies. The unique properties of SiC are high electric breakdown field ($4 \cdot 10^6$ V/cm), high saturated electron drift velocity ($2 \cdot 10^7$ cm/s) and high thermal conductivity (4.9 W/cmK). Therefore, SiC-based devices have been predicted and shown experimentally to handle much higher power density in comparison to the abovementioned transistor types, because of the superior material properties. The SiC devices need to be operated at very high supply voltage (48 V or higher) to fully show their advantage. The technology is still in the research labs, and several material and processing problems have to be solved before being commercially available. The total system cost is predicted to be lower, although the devices are more expensive.

Most of the RF power transistors are internally matched, because of the low impedance level for the large dies inside the package. The internal matching network consists of small-diameters (25–50 micrometer) bonding wires, also necessary for interconnects, and chip capacitors see ref.: T. Johansson, "Inside the RF Power transistor", *Applied Microwave & Wireless*, p. 34, September/October 1997. Microstrip structures, wave-guides etc. are not commonly used. In most cases, the bonding wires are short compared to the wavelength and can therefore be accurately represented as an inductance with finite series resistance. The chip capacitors are fabricated in e.g. silicon using techniques similar to the IC fabrication.

Multiple parallel bonding wires are used in the RF power transistors. The mutual inductance of the wires plays a large role for the device performance, because of the interaction between the wires in the package. Especially important are the gate-drain interactions for the FETs, as well as minimizing the total inductance, especially for the ground connections (source).

For the SiC devices, matching and packaging is similar to silicon technology, but in order to fully utilize the advantages of the SiC dies in a real transistor package, the connection of the die to the package should also be modified.

In order to improve the parasitic inductance and take advantage of the small size of the transistors the bonding pads are placed on both sides of the die in such a way that bonding wires will go perpendicularly to the gate and drain bonding wires. Multiple bonding wires can be connected to the source bonding pads, reducing the source inductance, wherein an additional advantage comes from such an arrangement by reducing the mutual inductance between source/gate and between source/drain due to orthogonal wire placement.

Figure 2:
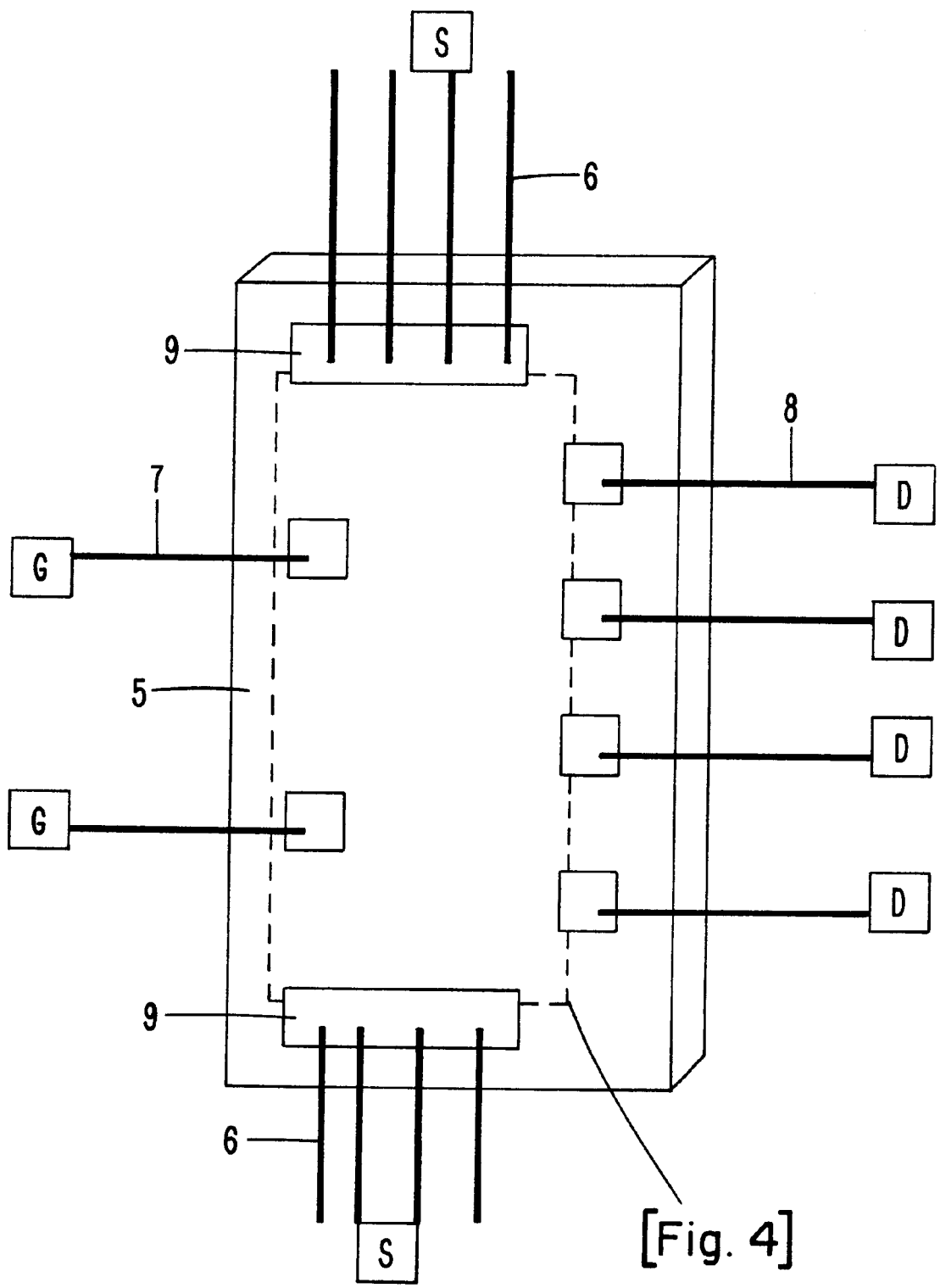
FIG. 2 is a design according to the invention for source bonding wires connected to pads on a die, where the source bonding wires are perpendicular to gate and drain bonding wires.

In FIG. 2 there is shown a preferred wire-design on a die 5 according to the invention, where source bonding wires 6 are placed on opposite sides of the die and perpendicular to gate and drain bonding wires 7, 8. Source bonding pads 9 are placed on the edge of the die 5 and the source bonding wires 6 are perpendicular to the gate and drain bonding wires 7, 8. The broken line shows the real placement of a transistor according to FIG. 4 on the die.

Figure 3:
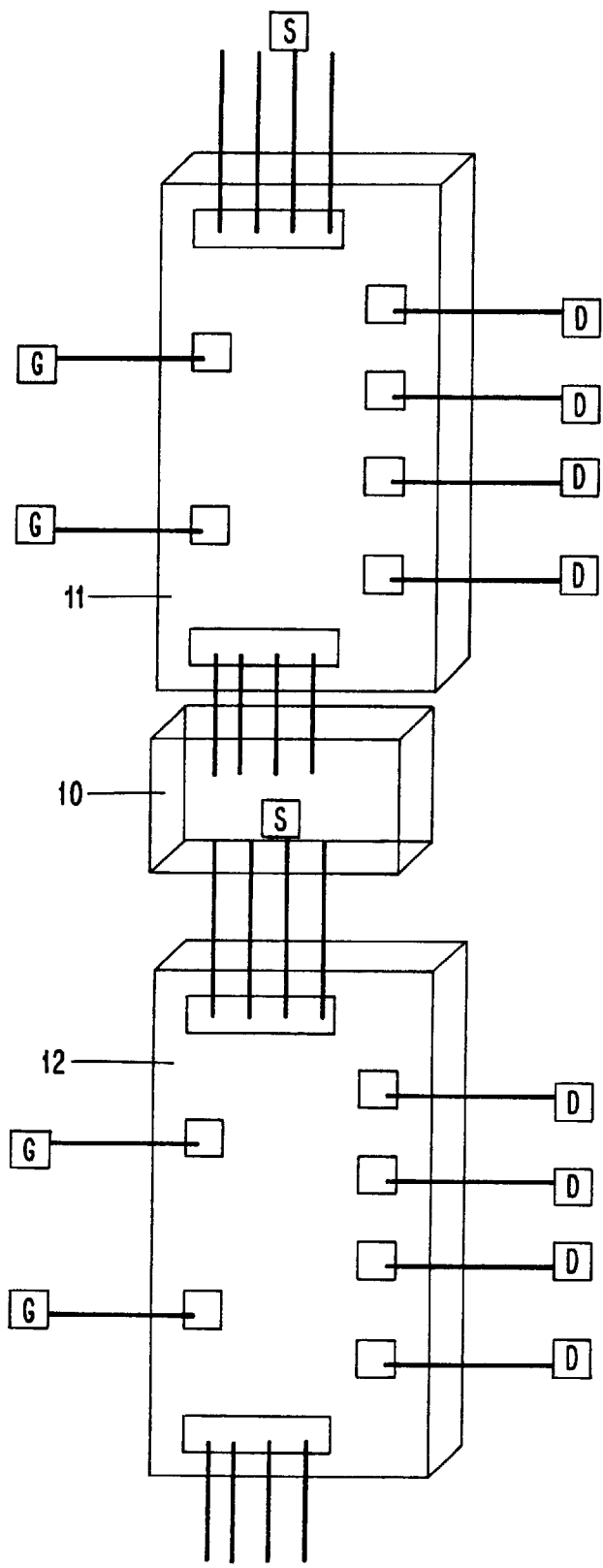
FIG. 3 is a design according to the invention, where a jumper chip is placed between dies.

In case of that multiple transistor dies have to be placed in the same package, as shown in FIG. 3, a jumper chip 10 can be placed between the dies 11, 12, to simplify the bonding procedure and further reduce the source inductance. This method of arrangement can even be utilized in case with a single die.

Figure 4:
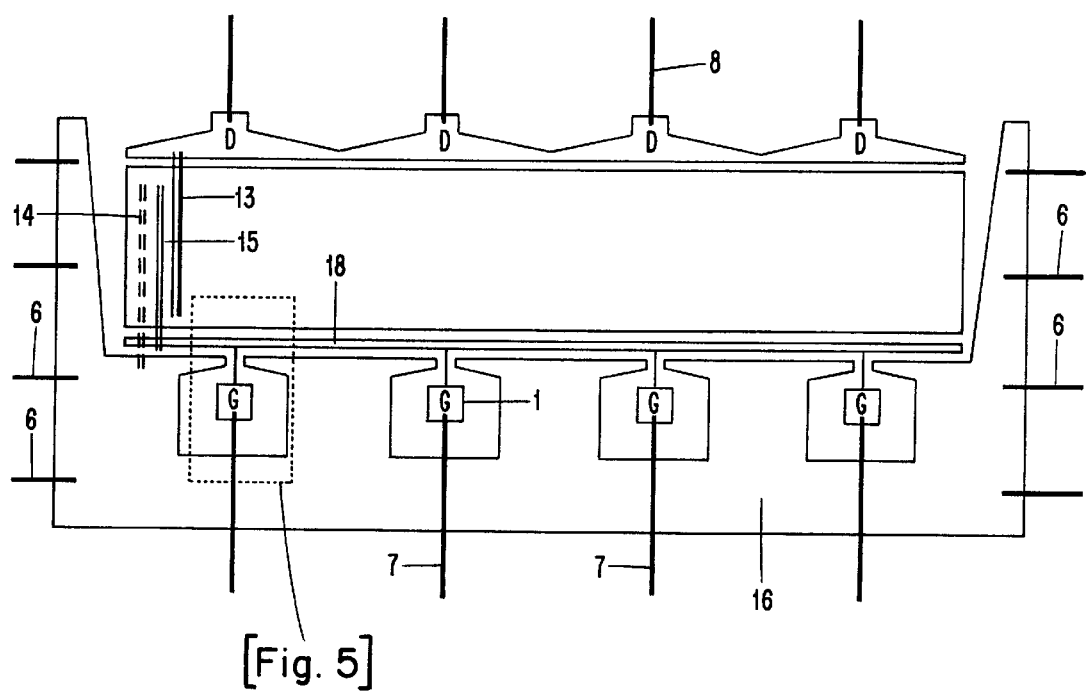
FIG. 4 is an example of a proposed transistor design for SiC MESFET according to the invention.

In FIG. 4 there is shown an example of a proposed transistor design for SiC MESFET, where the source metal extends to the sides of the die for the bonding. Two metal layers are used for the transistor, the first for metallization of connecting drain fingers 13, and the second for crossings between metal connecting source fingers 14 and metal connecting gate fingers 15, in order to connect the source and gate fingers on the same side of the transistor with the corresponding bonding pads. The SiC die is preferably rectangular and has a least dimension in a direction substantially parallel to the source bonding wire or wires. Furthermore, all source fingers are connected together by a common source metal rail or source runner 16 running in parallel with the side along which the gate bonding pads 1 are placed. The source bonding wires 6 are attached to the source metal rail 16 on the short side of the transistor perpendicularly to the gate bonding wires 7 and the drain bonding wires 8. All bonding wires in every group of wires are preferably parallel. The whole short side of the die can be used as a bonding area, which gives an additional advantage of having a freedom of optimal number and placement of the source bonding wires. The proposed transistor may be placed on a die as shown with the broken lines in FIG. 2, wherein the bonding pads in each group of bonding pads are preferably spaced apart at substantially equal intervals.

Figure 5:
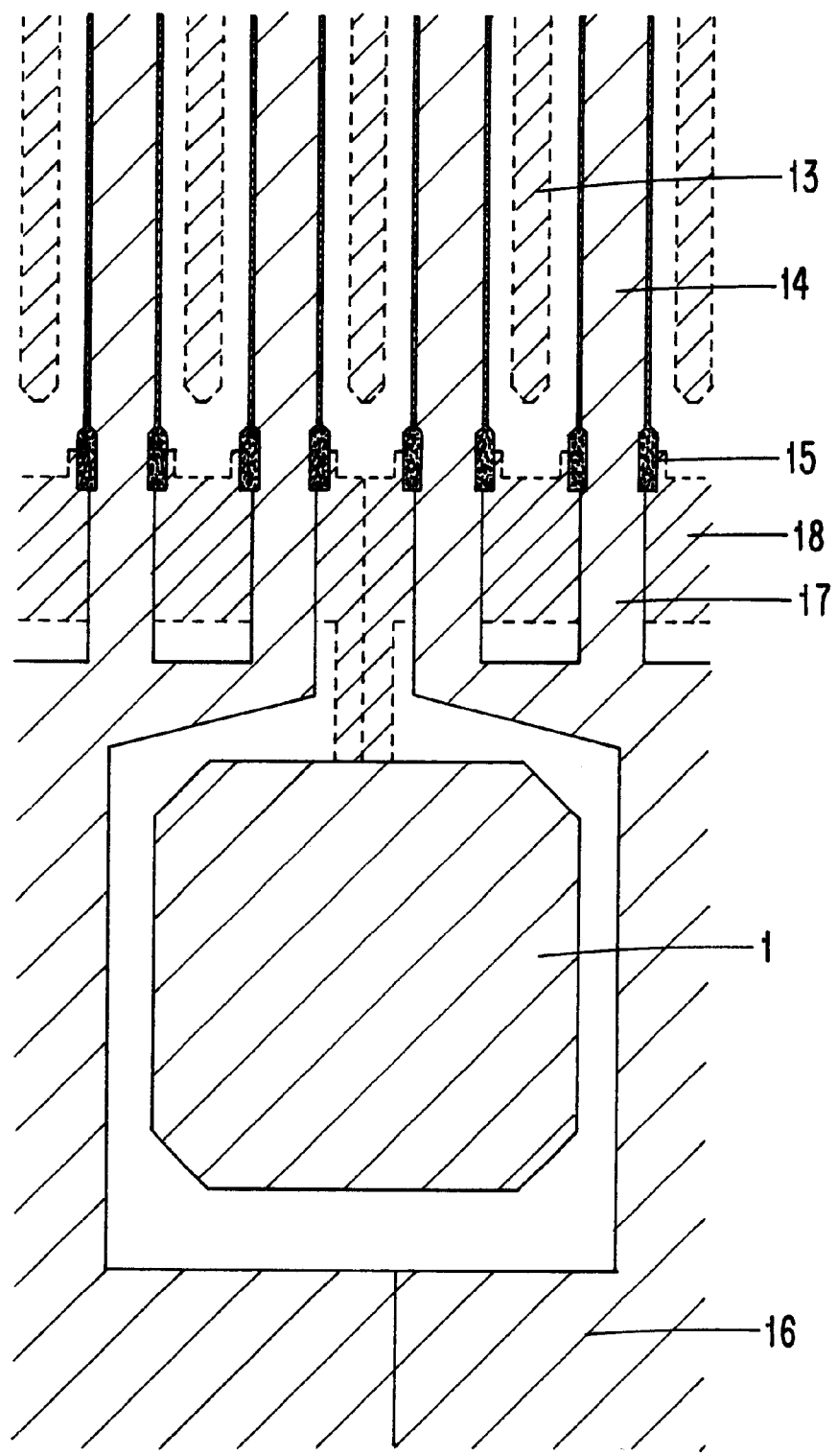
FIG. 5 is a part of the proposed transistor design for SiC MESFET according to the invention.

In FIG. 5 is shown a part of the SiC transistor design, where the different connecting fingers can be identified, wherein the two metal layers are used for the transistor. The first metal layer is used for metallization of the connecting drain fingers 13. The second metal layer is used for crossings between the metal connecting source fingers 14 and the metal connecting gate fingers 15 in order to connect the source and gate fingers on the same side of the transistor with the corresponding bonding pads. The source metal crossings 17 go over a gate runner 18 to the source runner 16.

While the forgoing description includes numerous details and specificities, it is to be understood that these are merely illustrative of the present invention and are not to be construed as limitations. Many modifications will be readily apparent to those skilled in the art, which do not depart from the spirit and the scope of the invention, as defined by the appended claims and their legal equivalents.

What is claimed is:

1. A method for interconnecting radio frequency power SiC field effect transistors comprising a die with bonded wires on pads, the bonded wires including source, gate and drain bonding wires, the method comprising the step of placing at least one bonding pad on different sides of the die in such a way that most of the source bonding wires are substantially perpendicularly placed to the gate and the drain bonding wires.

2. A device for interconnecting radio frequency power SiC field effect transistors comprising a die with bonded wires on pads, the bonded wires including source, gate and drain bonding wires, wherein at least one bonding pad is provided to be placed on different sides of the die, wherein most of the source bonding wires are placed substantially perpendicularly to the gate and the drain bonding wires.

3. A device according to claim 2, wherein all source bonding wires are placed perpendicularly to all gate and drain bonding wires.

4. A radio frequency power SiC field effect transistor comprising:
   a SiC die;
   interdigitated electrodes formed on the SiC die, each electrode having at least one electrode finger including at least one bonding pad;

at least two source bonding wires connected to the bonding pads, on opposite sides of the die, of a source electrode and extending in a direction predominantly parallel to the electrode finger of the electrode;

at least one gate bonding wire connected to the bonding pad of a gate electrode and extending predominantly parallel to the electrode finger of the electrode;

at least one drain bonding wire connected to the bonding pad of a drain electrode and extending predominantly parallel to the electrode finger of the electrode, wherein the two source bonding wires or most of the source bonding wires are substantially perpendicularly placed to the gate and drain bonding wires.

5. The device according to claim 4, wherein all source bonding wires are substantially perpendicularly placed to the gate and drain bonding wires.

6. The device according to claim 4, wherein the SiC die is substantially rectangular and has a least dimension in a direction substantially parallel to most of the source bonding wires.

7. The device according to claim 4, wherein the interdigitated electrodes each includes a plurality of bonding pads, the device further comprises additional bonding wires connected to each of said plurality of bonding pads of each electrode.

8. The device according to claim 4, wherein all bonding wires in every group of wires are parallel.

9. The device according to claim 4, wherein the plurality of bonding pads in each group of bonding pads are spaced apart at substantially equal intervals.

* * * * *